US00RE35350E

United States Patent [19]

Shahar et al.

[11] E Patent Number: Re. 35,350

[45] Reissued Date of Patent: Oct. 8, 1996

[54] METHOD AND APPARATUS FOR MEASURING SURFACE DISTANCES FROM A REFERENCE PLANE

[76] Inventors: Arie Shahar; Nira Schwartz, both of 2800-187 Plaza Del Amo, Torrance, Calif. 90503

[21] Appl. No.: 398,551

[22] Filed: Feb. 27, 1995

Related U.S. Patent Documents

Reissue of:

[64] Patent No.: 5,298,976
Issued: Mar. 29, 1994
Appl. No.: 976,834
Filed: Nov. 16, 1992

[51] Int. Cl.[6] ..... G01B 11/00

[52] U.S. Cl. ..... 356/375; 250/559.31; 250/559.38

[58] Field of Search ..... 356/372, 373, 356/375; 250/559.22, 559.27, 559.31, 559.38

[56] References Cited

U.S. PATENT DOCUMENTS 4,352,392 10/1982 Wittekoek et al. ..... 250/561

*Primary Examiner*—F. L. Evans
*Attorney, Agent, or Firm*—David Pressman

[57] ABSTRACT

A method of measuring the distance of an examined surface from a reference plane, by: (a) directing a parallel beam of radiation along a first optical path in which the parallel beam is focussed as a spot on the examined surface and reflected therefrom; (b) converting the reflected beam to a parallel beam; (c) directing a part of the reflected parallel beam through a second optical path in which the spot is focussed on a surface of a first detector located such that the position of the spot on the first detector includes both drawback errors caused by variations in reflectivity, scattering, and/or interference in the examined surface; and a plane displacement error, representing the distance between the plane of the examined surface and the reference plane; (d) directing another part of the reflected parallel beam through a third optical path in which the spot is focussed on a surface of a second detector located such that the position of the spot on the second detector includes only the drawback errors; (e) and utilizing the outputs of the first and second detectors for providing a measurement of the distance of the examined surface from the reference plane.

66 Claims, 3 Drawing Sheets

METHOD AND APPARATUS FOR MEASURING SURFACE DISTANCES FROM A REFERENCE PLANE

Matter enclosed in heavy brackets [ ] appears in the original patent but forms no part of this reissue specification; matter printed in italics indicates the additions made by reissue.

FIELD AND BACKGROUND OF THE INVENTION

The present invention relates to a method and apparatus for measuring distances of an examined surface from a reference plane. The invention is particularly useful in applications involving measuring such distances while examining a mask pattern on a semiconductor substrate, and is therefore described below with respect to such an application, but it will be appreciated that the invention could advantageously be used in many other applications as well.

Scanning electron microscopes are commonly used for the accurate indication of critical dimensions of patterns on silicon wafers for the production of integrated circuits. These indications are done when the patterns are at the focal plane of the microscope objective. Any deviation of the pattern from the focal plane affects the indications and therefore must be known so that the focal lens of the microscope objective or the pattern position can be properly readjusted.

A number of optical systems are known for measuring distances of surfaces from a reference plane. Examples of known techniques are described in an article published by H. D. Wolpert, Photonics Spectra, June 1987, pp 165–168 and in U.S. Pat. No. 3,264,935. Such systems are generally based on focussing a beam of radiation (e.g., a laser beam) on the examined surface and reflecting the beam to a position-sensitive detector such that any deviation in the examined surface from the reference plane produces a non-symmetry in the light spot projected on the detector with respect to the reference point on the detector. The amount of the non-symmetry is measured and indicates the corresponding distance of the examined surface from the reference plane.

However, such a method is sensitive to differences in reflection of the substrate. This greatly limits its use when employed for imaging a mask pattern on a semiconductor substrate for the manufacture of integrated circuits since patterned surfaces produce significant and non-uniform scattering and diffraction, and non-uniform reflection. This results in an error, known as a drawback, in the position indication. The drawback is not constant and depends on the random geometrical and optical structure of the pattern on the examined reflecting surface.

U.S. Pat. No. 4,356,392 and U.S. patent application Ser. No. 07/909,340 filed Jul. 6, 1992 disclose systems for reducing this drawback.

According to the system described in U.S. Pat. No. 4,356,392, an auxiliary beam is focussed along a first path to a spot on the examined surface and is reflected back along a second path to a second spot at a symmetric location to the location of the first spot on the examined surface. The second path includes a retro-reflector which inverts the beam direction back along the second path to a second spot which is symmetric in its shape and its location to the first spot on the examined surface. When the examined surface is in the position of the reference surface, the first and the second spot are located at the same position on the examined surface, such that after the double reflection to the examined surface, the two halves of the beam tend to cancel out local differences in reflection.

According to the system described in U.S. patent application Set. No. 07/909,340 filed Jul. 6, 1992, two identical beams are focussed along first and second paths to a first and a second spot respectively located at the same position on the examined surface when that surface is located in the reference plane. The first spot is imaged on a common detector via a path which includes the second path, and the second spot is imaged on the common detector via a path which includes the first path. The two images are symmetric to each other and are superimposed on each other, such that when the superimposed image is symmetric with respect to the reference point on the detector corresponding to the location of the reference plane, the superimposed images tend to cancel out local differences in reflection.

However, the systems described in U.S. Pat. No. 4,356,392 and in U.S. patent application Ser. No. 07/909,340 suffer from the following disadvantages: (1) since the drawback effect is eliminated only when the examined surface is in the location of the reference plane, the systems can be used only for detecting deviations of the examined surface from a reference plane without the ability to measure the amount of the deviations, i.e., the actual distance between the examined surface and the reference plane; and (2) the systems operate well to reduce the drawback effect only when the systems are perfectly aligned to project the two focussed beams to exactly the same spot on the examined surface. The latter requirement makes those systems very sensitive to instability of the optical components in the systems.

It would therefore be highly desirable to provide a method and apparatus for measuring the distance of examining surface from a reference plane, in which the above-described drawbacks are reduced or eliminated and in which the sensitivity of the method and the apparatus to the instability of their optical components is reduced. It would be particularly desirable to provide such a method and apparatus which could be used in examining patterned substrates for the manufacture of integrated circuits.

BRIEF SUMMARY OF THE INVENTION

According to one aspect of the present invention, there is provided a method for measuring the distance of an examined surface from a reference plane by: directing a parallel beam of radiation along a first optical path which includes first focussing means for focussing the parallel beam as a spot on the examined surface and reflecting it therefrom as a reflected beam; and converting the reflected beam to a parallel beam. A part of the reflected parallel beam is directed through a second optical path which includes second focussing means for focussing the spot on a surface of a first detector located such that the position of the spot on the first detector includes both: (i) drawback errors caused by variations in reflectivity, scattering, and/or interference in the examined surface, particularly if it is a patterned surface; and (ii) a plane displacement error, representing the distance between the plane of the examined surface and the reference plane. Another part of the reflected parallel beam is directed through a third optical path including third focussing means for focussing the spot on a surface of a second detector located such that the position of the spot on the second detector includes only the drawback errors (i). The outputs of the first and second detectors are then utilized for providing a measurement of the distance of the examined surface from the reference plane.

According to further features in the described preferred embodiments, the magnification in the second optical path is different from that in the third optical path. Accordingly, the drawback errors (i) detected by the second detector are adjusted by the ratio between the two magnifications, in utilizing the outputs of the first and second detectors for providing a measurement of the plane displacement error (ii) alone.

According to still further features in the described preferred embodiments, the surface of the first detector is coplanar with a virtual axis of the first focussing means, and the surface of the second detector is perpendicular to a virtual axis of the first focussing means. A virtual axis of the respective focussing means is defined as a line on which all the points on the optical axis of the first focussing means appear as virtual images when projected onto the surface of the respective detector.

Two embodiments of the invention are described below for purposes of example. In one described embodiment, the third optical path is a straight path separate and distinct from the second optical path. In the second described embodiment, the part of the parallel beam in the third optical path is reflected back to the first optical path and includes image processing means which processes the output of the camera to determine from the image focussed thereon the drawback corresponding to that of the first detector.

According to a still further feature in the second described embodiment, the second detector is the CCD camera and includes said image processing means.

The invention also provides apparatus for measuring, in accordance with the above method, the distance of an examined surface from a reference plane.

Further features and advantages of the invention will be apparent from the description below.

BRIEF DESCRIPTION OF THE DRAWINGS

The invention is herein described, by way of example only, With reference to the accompanying drawings, wherein.

PRIOR ART (FIG. 1)

Figure 1:
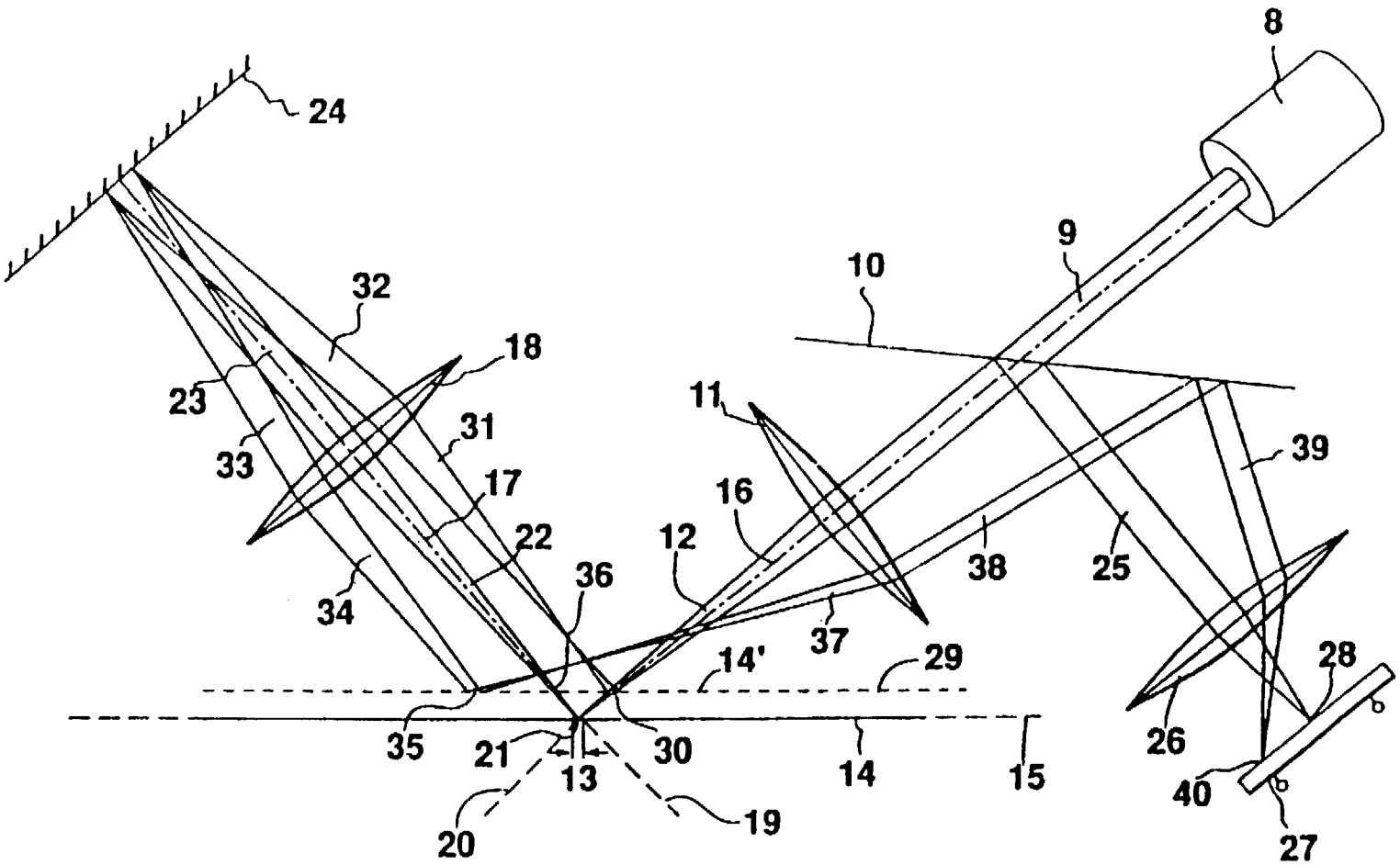
PRIOR ART FIG. 1
FIG. 1 diagrammatically illustrates a prior art system for detecting the deviation of an examined surface from a reference plane.
Figure 2:
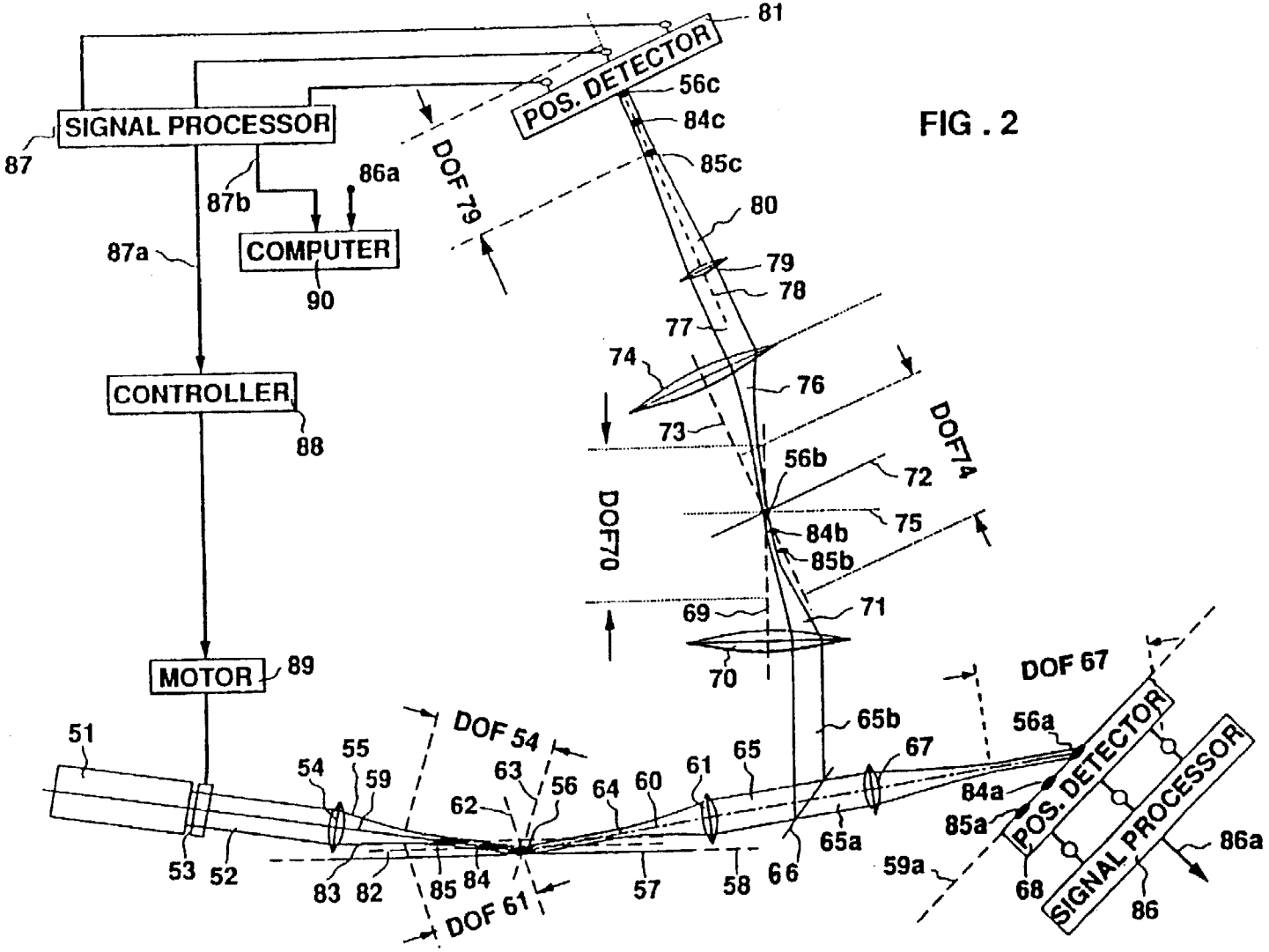
FIG. 2 is a diagrammatic view illustrating one system in accordance with the present invention for measuring the distance of an examined surface from a reference plane.
Figure 3:
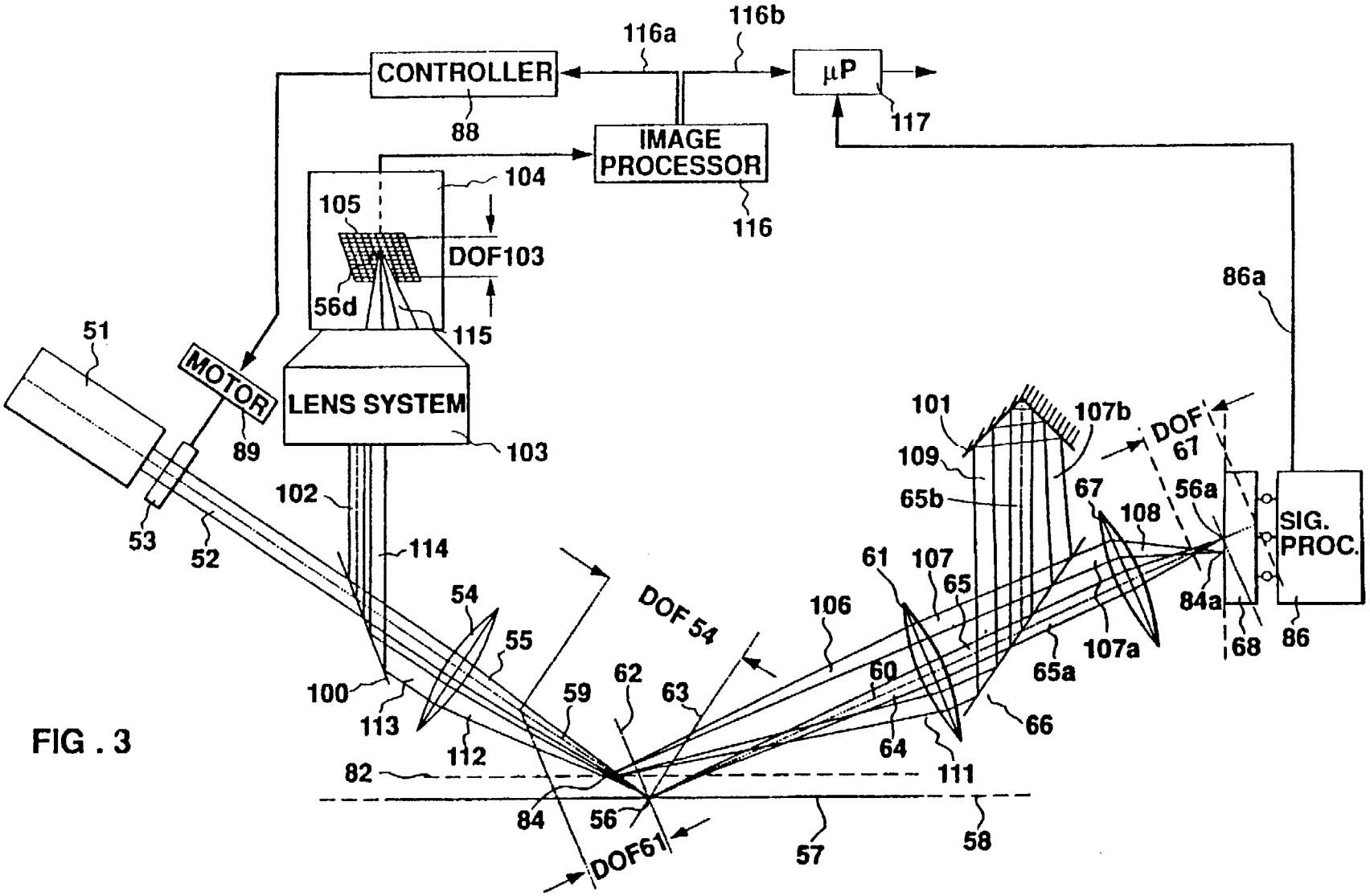
FIG. 3 diagrammatically illustrates a second system in accordance with the present invention.

The known apparatus as illustrated in FIG. 1 will first be described to aid in understanding the method and apparatus of the present invention as illustrated in FIGS. 2 and 3.

The known apparatus as illustrated in FIG. 1 includes a light source 8 that emits an auxiliary beam 9 through a beam splitter 10 towards a lens system 11. Lens system 11 converts beam 9 into a beam 12 focussed to a small radiation spot 13 on the examined surface 14 located in a reference plane 15. Optical axes 16 and 17 of the system lenses 11 and 18, their focal planes 19 and 20, and the reference plane 15, all intersect at a common point 21 located in the center of spot 13 on the examined surface 14.

Beam 22 reflected from the examined surface 14 is converted by lens system 18 into a parallel beam 23 and is directed towards a retro-reflector 24. Beam 23 is reflected back along its original path and is focussed by lens 18 at the same radiation spot 13 to again image the spot 13 in a symmetric manner with respect to point 21. The light beam reflected the second time from the radiation spot 13 is directed back along the original path of beams 12 and 9 via lens system 11, and then part of it is separated by beam-splitter 10 in the form of a parallel beam 25. Beam 25 is focussed by the lens system 26 on position detector 27 to produce an image 28.

Each point in the image 28, and its corresponding symmetric point with respect to the center of image 28 which relates to point 21, are influenced to the same extent by the local difference in reflection in the examined surface 14. The local differences in reflection are thus substantially cancelled, resulting in reducing the drawback effect to provide an accurate measurement.

However, when the examined surface is located in a plane, e.g., 29 which is offset from the reference plane 15, beam 12 is focussed by lens system 11 into a radiation spot 30 on the examined surface 14' in the offset plane 29. Beam 31 reflected from spot 30 is convened by lens system 18 into a parallel beam 32. Parallel beam 32 is reflected back by retro-reflector 24 as a parallel beam 33, and is convened by lens system 18 into beam 34 which is focussed at radiation spot 35 laterally of spot 30 on the examined surface 14'. The two radiation spots 30 and 35 are located symmetrically on opposite sides of the intersection point 36 between the optical axis 17 of lens 18 and the examined surface 14' in plane 29. Beam 37 is reflected from radiation spot 35 and is convened by lens system 11 into parallel beam 38. A part of beam 38 is separated by beam-splitter 10 as parallel beam 39 and is focussed on position detector 27 by lens system 26 to produce the image 40 formed after double reflection of the beam from spots 30 and 35 on the examined surface 14'.

When the examined surface 14' in plane 29 includes a mask pattern, the position indication of the image 40 on position detector 27 may be erroneous due to the drawback effect which does not cancel out when radiation spots 30 and 35 are not located at exactly the same location and are reflected from different patterns on the examined surface 14'. For this reason, when the examined surface includes a mask pattern, the above described system can only detect position deviations of the examined surface from a reference plane with out the ability to measure quantitatively the mount of the deviation. Further details of the construction and operation of this prior art system as illustrated in FIG. 1 may be had by reference to the above-cited U.S. Pat. No. 4,356,392.

Another known apparatus is described in the above-cited U.S. patent application Ser. No. 07/909,340 filed Jul. 6, 1992.

However, such known position detecting systems suffer from the drawback effect when the examined surface includes mask patterns and is out off the reference plane. In addition, even when the examined surface is located in the reference plane, the drawback is substantially reduced only when all the beams are reflected from exactly the same spot on the examined surface. This requires very high precision in the systems to be aligned and makes these systems highly sensitive to instability of their optical components. These limitations are particularly significant when the systems are used for examining patterned surfaces of semiconductor substrates for the manufacture of integrated circuits.

DESCRIPTION OF PREFERRED EMBODIMENTS

The System of FIG. 2

FIG. 2 illustrates one detection system in accordance with the present invention. As shown in FIG. 2, a light source 51 emits an auxiliary parallel beam 52 through a circular neutral-density filter 53. Beam 52 is converted by lens system 54 into a focussed beam 55 to project a small focussed spot 56 on the examined surface 57 located in the reference plane 58. Optical axes 59 and 60 of lens systems 54 and 61, their focal planes 62 and 63, examined surface 57, and reference plane 58, all intersect in the center of spot 56.

Beam 64 reflected from focussed spot 56 on the examined surface 57 is converted by lens system 61 into a parallel beam 65. Part of beam 65 is transmitted through beam splitter 66 in the form of a parallel beam 65a. Beam 65a is focussed by lens system 67 on position detector 68 to produce the image 56a of radiation spot 56 on the examined surface.

The other part of beam 65 is reflected out of beam splitter 66 in the form of a parallel beam 65b, and is directed off-axis and parallel to optical axis 69 of lens system 70. Beam 65b is convened by lens system 70 into a focussed beam 71. Beam 71 is focussed in order to produce, on focal plane 72 of lens system 70, the image 56b of radiation spot 56. Optical axes 69 and 73 of lens systems 70 and 74, and their focal planes 72 and 75, all intersect in the center of image 56b. Beam 76 propagating from image 56b, which serves as an object, is convened by lens system 74 into a parallel beam 77. Optical axis 78 of lens system 79 is parallel to optical axis 73 and coincides with the optical axis of beam 77. Beam 77 is converted by lens system 79 into a focussed beam 80 in order to project on position detector 81 the image 56c of the same examine surfaced under radiation spot 56 on which its other image 56a is projected on position detector 68.

For simplifying the drawing, in situations where the examined surface 57 is located out of the reference plane 58, only the positions of the images which correspond to these positions of the examined-surface 57 are illustrated without the tracing of the beams that produce those images. For example, when examined surface 57 is located out of reference plane 58, but in plane 82 or 83, beam 55 is focussed to a small radiation spot 84 or 85 on examined surface 57, respectively. Such radiation spots as 56, 84 or 85, are all located along optical axis 59 of lens system 54. Thus the corresponding images 56a, 84a or 85a of the areas of the examined surface under those radiation spots are projected by lens system 67 onto the detecting plane of position detector 68 and are all aligned along line 59a that represents the virtual image of optical axis 59. The detecting plane of position detector 68 is aligned to contain line 59a. Similarly the corresponding images 56b, 84b or 85b of the areas of the examined surface under radiation spots 56, 84 or 85 produced by lens system 70 are all aligned along optical axis 73 of lens system 74 which coincides with the line that represents the virtual image of optical axis 59.

It will thus be seen that in the optical path traversed by parallel beam 65b from beam splitter 65, focussing lens 70 focusses the illuminated spot on the optical axis 73 of focussing lens 74, and that focussing lens 74 in turn focusses the spot on the optical axis 78 of focussing lens 79, and further that the optical axis 78 of lens 79 is perpendicular to the surface of detector 81. Thus, the three images 56c, 84c and 85c are all located on a line (i.e., the optical axis 78 of lens 79) which is perpendicular to the detector 81.

Images 56b, 84b or 85b, focussed by lens 70 on the optical axis 73 of lens 74, are all located within the range of the depths of focus (DOF74) of lens system 74. Images 56b, 84b or 85b serve as objects for lens systems 74 and 79 to produce images 56c, 84c or 85c that are actually the images of the same areas under radiation spots 56, 84 or 85 on which their other images 56a, 84a or 85a are projected on position detector 68. Thus the shape and intensity of images 56c, 84c or 85c on position detector 81 are linearly-proportional to the shape and intensity of images 56a. 84a or 85a on position detector 68, respectively. Images 56c, 84c or 85c are all projected along optical axis 78 of lens system 79 into the range of the depth of focus (DOF79) of lens 79 and from there to a fixed spot on the detecting plane of position detector 81 which is also located within the depth of focus (DOF79) of lens 79.

The centers of all the images 56c, 84c, 85c on position detector 81 are located on a common line perpendicular to the position detector 81 and are therefore independent of the position of the examined surface 57 with respect to the reference plane 58. The intersection point of the common and fixed line with the detector surface serves as an "absolute reference point". This "absolute reference point" indicated by the positions of images 56c, 84c or 85c on position detector 81, is thus independent of the position of the examined surface 57 with respect to the reference plane, and therefore indicates only the drawback errors.

The mathematical relationship between the vertical displacement δh of examined surface 57 from reference plane 58, and the corresponding image displacement δH on position detector 68, is as follows:

$$\delta H=\delta h*\cos(90-2\alpha)*M1/\sin(\alpha)=2*\delta h*\cos(\beta)*M1 \quad (1)$$

wherein α is the angle between the optical axis 59 of lens system 54 and the reference plane 58, which is equal to the angle between optical axis 60 of lens system 61 and reference plane 58;

and M1 is the magnification of lens system 61 and 67 that is given by:

$$M1=F67/F61 \quad (2)$$

wherein F67 and F61 are the focal lengths of lenses system 67 and 61, respectively.

The magnification of the images on position detector 81 is M2 and is given by:

$$M2=F70/F61*F79/F74 \quad (3)$$

wherein F70, F74 and F79 are the focal lengths of lenses 71, 74 and 79, respectively.

When the intensity of beam 52 is distributed symmetrically around its center, and the examined surface is a mirror-like surface (i.e., flat with uniform optical properties), then the position indication of position detector 68 is correct and according to the relationships of equations (1) and (2). As explained above, the position of the spot with respect to detector 81 is independent of the position of the examined surface 57, and serves as an "absolute reference point".

To assure that the measurements of position detectors 68 and 81 will not be affected by the intensity of the images on their planes, a normalized signal may be used. The normalization of the signal is done by two signal processing circuits 86 and 87, one for each of the position detectors 68 and 81, respectively. Such a processor is available commercially and is supplied by Hamamatzu, type No.c3683-01. Its inputs are fed by the signals of the two outputs of the position detector, V1 and V2. The output signal of the processor is the normalized signal and equals:

$$(V1-V2)/(V1+V2) \quad (4)$$

When examined surface 57 includes mask patterns, the images on position detectors 68 and 81 may suffer from non-symmetric distribution of their intensity due to the above-described drawbacks (i.e., local variations in reflectivity, scattering and diffraction of examined surface 57), even when the intensity of beam 52 is distributed symmetrically around its center. Position detectors indicate the position of the image on their plane as the point of the center of gravity of the image intensity. Thus any non-symmetric distribution of the intensity of the images on position detectors 68 and 81 causes a draw-back effect which tolerates their position measurement.

As explained earlier, the position of the images on position detector 81 is fixed and their centers are always at the "absolute reference point". Thus any position measurement of detector 81 which differs from the position of the "absolute reference point" indicates the existance of draw-back.

The amount of the draw-back in position detector 81 is equal to the deviation between the position of the actual measurement and the position of the "absolute reference point". The amount of the draw-back in position detectors 68 and 81 depends on the sizes of the images on them, namely on the magnifications M1 and M2, respectively. Since the images on position detectors 64 and 81 are linearly-proportional in their shape and intensity, the amount of the draw-back δdr in position detector 68 can be derived from the measured amount of the draw-back δDR in position detector 81 according to the following relationship:

$$\delta dr=-(\delta DR*M1/M2) \quad (5)$$

The minus sign in the right hand of equation (5) indicates that the draw-backs δdr and δDR on position detectors 68 and 81, respectively, affect the measurement on detectors 68 and 81 in opposite directions. The opposite polarity between δDR and δdr is because the images (e.g., 56a, 84a or 85a), and their draw-back δdr on position detector 68, are oriented inversely with respect to the images (e.g., 56c, 84.2 or 85c) and their draw-back δDR, on position detector 81, respectively.

An accurate indication of the distance δh of the examined surface 57 from reference plane 58 can be derived as follows: derive the amount of the draw-back δdr on position detector 68 from the measured amount of the draw-back δDR on position detector 81; modify the measured value of δH, which is measured on position detector 68, to its correct value δH'=δH–dr according to the derived amount of the draw-back δdr in position detector 68; and substitute δH with the modified value δH' in equation (1) in order to derive the correct value of δh from the measured position-deviations δH and δDR measured by position detectors 68 and 81, respectively, and the known magnifications M1 and M2.

The expression for the correct value of δh is given by:

$$\delta h=\delta H'/(2*\cos(\alpha)*M1)=(\delta H-\delta DR*M1/M1)/(2*\cos(\alpha)*M1) \quad (6)$$

in a situation when M1=M2=M δh is equal to:

$$(\delta H-\delta DR)/(2*\cos(\alpha)*M)$$

The calculations of equation (6) can be done by a microprocessor chip, indicated at 90 in FIG. 2, having its inputs fed by outputs 86a and 87b of signal-processors 86 and 87, respectively.

In a proper operation of the apparatus, the quality of the images projected on position detectors 68 and 81 has to be similar for allowing an accurate derivation of the draw-back amount δdr on position detector 68 from the measured mount of the draw-back δDR on position detector 81. High quality of the images (56a, 84a or 85a) projected on position detector 68 can be achieved by using a conventional design for imaging lens-systems 61 and 67 based on axial beams 64, 65 and 65a. Such design for the imaging lens-systems 70, 74 and 79 to project the images (e.g., 56c, 84c or 85c) based on the axial beams 65b and 71, reduces the quality of the imaging, as discussed below.

The images of the radiation spots (e.g., 56, 84 or 85) on the examined surface 57, corresponding to the different distances of surface 57 from the reference plane 58, are projected along a line 59a or 73. These lines represent virtual axes of optical axis 59, which is oriented at an angle 2*α with respect to the optical axis of the projection lens 67 or 70, respectively. This situation involves minor significant problems for imaging lens-systems 61 and 67 which are eliminated by aligning position detector 68 along line 59a.

On the other hand, such a situation may cause significant problems for imaging lens-systems 70, 74 and 79. In this situation, when beam 65a is an axial beam, beam 76 that continues from image 56b on optical axis 73 of lens system 74, creates an angle of 2*α with respect to optical axis 73. Beam 76 has to be collected by lens system 74 and thus it has to have a very low F-number for any value of α that is higher than 10°. In addition the relatively high value of angle 2*α between beam 76 and the optical axis of lens system 74 results in a reduction in the quality of the images (e.g., 56c, 84c or 85c) on position detector 81 due to off-axis aberrations. The amount of the off-axis aberrations due to the large angle 2*α between beam 76 and optical axis 73 of lens system 74 can be reduced by shearing this amount between lens systems 70 and 74 using beam 65b and lens system 70 in an off-axis configuration.

FIG. 2 illustrates a shearing of equal amount of off-axis angle for each of the lens systems 70 and 74 when the angle between beam 76 and optical axis 73 equals the angle between beam 71 and optical axis 69, and both of them equal angle α. This configuration of equal shearing of the amount of the off-axis angle between lens systems 70 and 74 has the advantage that it is relatively free of off-axis aberrations because all the off-axis aberrations produced by lens system 74 in convening an off-axis parallel beam (e.g., 65b) into an image (e.g., 56b, 84b or 85b), are canceled out when such images are converted by lens system 74 into parallel beams (e.g., beam 77).

Another configuration is possible to produce equal shearing of the amount of off-axis angle between lens-systems 70 and 74, based on the beam (e.g., 65b) that passes through the center of lens system 70 and is directed with a tilted angle with respect to optical axis 69 to produce a beam (e.g., 71) oriented with an angle α with respect to optical axis 73. This configuration has the advantage that a smaller lens system 70 can be used, but it suffers from a significant disadvantage that most of the commercial lens systems, even those with a small F-number, are designed to their best performance when a parallel beam (e.g., 65b or 77) propagates in parallel to its optical axis.

Optical axis 78 of lens system 79 is off-axis to optical axis 73 of lens system 74 and coincides with the optical axis of beam 77 to project images (e.g., 65c, 84c or 85c) by a beam (e.g., axial beam 80). In this configuration, the position of the images (e.g., 56c, 84c or 85c) on the position detector 81 is fixed and is insensitive to the location of position detector 81. This insensitivity is achieved because the images (e.g., 56c, 84c or 85c) are projected on position detector 81 by a beam (e.g., 80) that propagates along optical axis 78, normal to the detecting plane of position detector 81 located within the range of focus DOF79 of lens system 79.

The system illustrated in FIG. 2 can accurately measure the deviations in the distance δh of the examined surface 57 from the reference plane 58 over a range which depends on the depths of focus DOF54, DOF61, HDOF67, DOF70, DOF74 and DOF79 of lens-systems 54, 61, 67, 70, 74 and 79, respectively. All the regions illustrating those depths of focus are enlarged in the drawing without proportion to the other dimensions of the system to more clearly show them. As long as images 56, 84 or 85 are located within the range of DOF79, and DOF61, images 56a, 84a or 85a are located within the range of DOF67, images 56b, 84b or 85b are located within the range of DOF70 and DOF74, and images 56c, 84c or 85c are located within the range of DOF79, the system operates properly and accurately measures the distance-displacement δh of the examined surface 57 from reference plane 58.

The depths of focus of the lenses in the system are inversely proportional to their optical apertures. For allowing the system to operates properly within a wide range of distance-deviations δh of the examined surface 57 from reference plane 58, the depths of focus of the lenses in the system have to be long and requires small optical apertures in the system.

The dynamic range required from the position detectors 68 and 81 is inversely proportional to the optical apertures in the system. Thus a system that operates properly within a wide range of distance-deviations δh of the examined surface 57 from the reference plane 58 requires a wide dynamic range for position detectors 68 and 81. For distance-deviations δh in a range of several tens of μm, the dynamic range required from position detectors 68 and 81 is similar to that required from the position detector in the system described in the above cited U.S. patent application Ser. No. 07/909,340 because in both systems the optical apertures can be wide, and both operate with only one reflection of the beam from the examined surface.

On the other hand, the system illustrated in FIG. 2 requires a narrower dynamic range for position detectors 68 and 81 than required for the position detector in the FIG. 1 system described in the above cited U.S. Pat. No. 4,356,392 because the double reflection of the beam from the examined surface in the FIG. 1 system attenuates dramatically the beam intensity on the position detector when the system is used for measurements involving patterned surfaces. For distance-deviation δh in a range of several hundreds μm, the dynamic range required for position detectors 68 and 81 is wide but it is still narrower than that required in the system described in the above cited U.S. Pat. No. 4,356,392.

For narrowing the dynamic range required from the position detectors 68 and 81, the system of the present invention includes an automatic intensity controlling subsystem, consisting of controller 88 and circular neutral-density filter 53 integrated with a stepping-motor 89. Controller 88 is fed by an electrical signal from output 87a of signal processor 87 which is proportional to the beam intensity (e.g., or beam 80) on position detector 81. Stepping-motor 89 is fed by an electrical signal produced by controller 88 in order to operate stepping-motor for rotating the circular neutral-density filter 53 to produce an attenuation which maintains constant beam intensity on the position detectors 81 and 68.

Stability of a system is defined according to the period of time that it operates properly without the necessity for realignment. Relative to other systems described in the above cited prior art U.S. Pat. No. 4,356,392 and U.S. patent application Ser. No. 07/909,340, the measurement accuracy of the system illustrated in FIG. 2 has very low sensitivity to the position and orientation tolerances of its optical components. Because of this, the need for realignment is substantially reduced. However, when needed, this can be achieved by recalibrating the position of the "absolute reference point" on the position detector 81 and the position of the image on the position detector 68. The latter corresponds to the position of the examined surface 57 when there is a zero drawback and is located in the reference plane 58.

In the present invention, the translation and the rotation tolerances that require realignment of the system are bigger by two or three orders of magnitude than those which require realignment of the systems described in the above cited U.S. Pat. No. 4,356,392 and U.S. patent application Ser. No. 07/909,340. These two known systems require for their proper operation a very high alignment accuracy for precise overlapping of the two radiation spots projected on their examined-surfaces when they are located in the reference plane.

The system illustrated in FIG. 2 can be convened to a more compact one by folding back the optical path of beam 65b along itself. In this configuration, lens-systems 61 and 54 are reused along the return optical path to operate similarly to, and instead of, lens-systems 70 and 74 which are located along the on-going optical path of the system illustrated in FIG. 2. Such system is illustrated in FIG. 3.

The System of FIG. 3

The system illustrated in FIG. 3 is similar to that of FIG. 2 and operates in a similar manner, and therefore the same reference numerals have been used to identify the corresponding elements.

In the system illustrated in FIG. 3, beam 52 passes through beam splitter 1.00 in order to project small radiation spots 56 or 84 on the examined surface 57 located in reference planes 57 or 82, respectively. Images 56a and 84a correspond to the radiation-spots 56 or 84 on the examined surface 57, respectively, and are projected onto position detector 68 at positions which depend on the position of the examined surface 57.

Beam 65b corresponds to the situation wherein the examined surface 57 is located in the reference plane 58. The beam is reflected back along itself from a corner cube retro-reflector 101 and propagates backwards along the first-mentioned optical path, of beams 65 and 60 via lens system 61. Beam 65b, which is reflected along itself, is focussed by lens-system 61 in order to project the pattern of an image (e.g., image 56b illustrated in FIG. 2) exactly back on its generating-pattern of radiation-spot 56. From spot 56 it is reflected along the optical path of beams 55 and 52 via lens system 54 and is reflected out by beam splitter 100 in the form of beam 102.

Beam 102 is directed along the optical axis of a lens-system 103 mounted on a CCD camera 104. Similar to the projection of image 56c on position detector 81 as illustrated in FIG. 2, beam 102 is converted by lens-system 103 into a focussed beam in order to project on the CCD-detectors plane 105 the image 56d of radiation spot 56 of the examined surface 57.

When the examined surface 57 is located in a plane 82 out of the reference plane 58, beam 106 reflected from spot 84 is converted by lens system 61 into parallel beam 107. Part of beam 107 passes through beam splitter 66 as a parallel beam 107a. Beam 107a is converted by lens system 67 into a focussed beam 108 in order to project on position detector 68 the image 84a of the examined surface 57 spot 84. The other part of beam 107 is reflected out from beam splitter 66 in the form of parallel beam 107b directed towards corner cube retro-reflector 101.

Beam 107b is reflected from retro-reflector 101 in the form of parallel beam 109 oriented precisely parallel to beam 107b. Beam 109 is reflected from beam splitter 66 as parallel beam 110 oriented precisely parallel to beam 107. Beam 110 is converted by lens system 61 into a focussed beam 111 in order to project the pattern of an image (e.g., image 84b illustrated in FIG. 2) exactly back onto its generating spot 84. Beam 112 reflected from spot 84 on the examined surface 57 is converted by lens-system 54 into parallel beam 113 oriented precisely parallel to beam 52.

Beam 113 is reflected out of beam splitter 100 in the form of parallel beam 114 oriented precisely parallel to beam 102 and is directed towards lens-system 103. Similar to the system illustrated in FIG. 2 in which the images (e.g., 56c. 84c or 85c) are all projected on position detector 81 into the same position, beam 114 is convened into a focussed beam 115 in order to project on CCD-detectors plane 115 the image of the examined surface 57 spot 84 into the exact location of image 56d. All the centers of the images projected on CCD-detectors plane 105 are located at a common and fixed line that serves as an "absolute reference point", independent of the position of the examined-surface 57. The "absolute reference point is identified in a situation without draw-back as the center of the image, such as image 56d of examined-surface 57, with a mirror like surface.

The corner cube retro-reflector 101 of the system illustrated in FIG. 3 can be a retro-reflector of any other type provided that it has the property that any ray entering its aperture will be reflected and emerges from the entrance/exit parallel to itself, but with opposite direction of propagation. A retro-reflector, such as retro-reflector 101 illustrated in FIG. 3, folds the optical path along beams 65b, 71, 76 and 77 via lens systems 70, 74 and 79 as illustrated in the system of FIG. 2, backwardly along beams 65b, 65, 64, 59, and 52 via lens-systems 61, 54 and 103. In this configuration, the patterns of images (e.g., 56b or 84b, which are located on the optical axis 73, FIG. 2) are projected back to their generating spots on the examined surface 57.

The generating spots, such as 56 or 84, are distributed along the optical axis 59 according to their displacement from the reference plane 58. As long as spots 56 or 84 are within the range of depths of focus DOF54 and DOF61, the configuration illustrated in FIG. 3 assures the projection of all the images on CCD-detectors plane 105 into the same spot whose center serves as an "absolute reference point", independent of the position of the examined surface 57. Thus the operation of lens systems 61, 54 and 103 on the folded-back optical path, as illustrated in FIG. 3, is similar to the operation of lens systems 70, 76 and 79 on the on-going optical path as illustrated in FIG. 2.

The retro-reflector of the system described in the above cited U.S. Pat. No. 4,356,392 and illustrated in FIG. 1 does not operate in the same way. In that system, the beam which is reflected from the retro-reflector 24 and which hits the examined surface the second time, projects the image of the reflected spot 35 laterally of the generating spot 30 as described above with respect to FIG. 1, and not exactly on the generating spot as in the present case. The position of the images projected on the position detector 27 depends on the position of the examined surface 14.

For the reasons discussed below, lens system 79, and the position detector 81 in the system illustrated in FIG. 2, have been changed to their corresponding lens-system 103 and CCD-detectors plane 105 illustrated in FIG. 3. In the system illustrated in FIG. 2, images, such as images 56c, 84c or 85c projected on position detector 81, are linearly-proportional in their shape and intensity distribution to images 56a. 84a or 85a which are projected on position detector 68. In this situation the amount of the draw-back δDR measured on the position detector 81 relative to the "absolute reference point" is also linearly-proportional to the amount of the draw-back δdr on position detector 68 and can be used for deriving δdr according to equation (5). δdr is derived for modifying the correct position δH' of images, such as images 56a, 840 or 85a, in order to derive the accurate position displacement δh of the examined surface 57 from reference plane 58 according to equation (6).

On the other hand in the system illustrated in FIG. 3, images (e.g., 56d) which are projected on CCD detectors plane 105, are linearly-proportional to the images (e.g., 56a, 84a or 85a) which are projected on position detector 68 only in their shape, but are not linearly-proportional in their intensity distribution. The linear-proportionality of the intensity is lost because only one reflection of the beam from the examined surface 57 is involved in producing the images (e.g., 56a. 84a or 85a) on position detector 68, while double reflection of the beam from the examined surface 57 is involved in producing the images (e.g., 56d) on CCD-detector plane 105.

Position detectors (e.g,, 68 and 81) indicate the position of an image as the center of gravity of its intensity. In the above described situation, if a position detector would be placed at another location than the CCD-detectors plane 105, its position indication would not be linearly-proportional to the position indication of position detector 68. In this configuration the relationships between the position indication of position detector 68 and 81 would also be pattern dependent. It would therefore be impossible to derive the amount of the drawback δdr on position detector 68 from the amount of draw-back measured on position detector 81, or to modify the measured position of the images, such as images 56a, 84a or 85a, on position detector 68.

In this situation it would also be impossible to derive the correct amount of the displacement δh of the examined surface 57 from reference plane 58. Using the lens system 103 and CCD-detectors plane 105 in the system of FIG. 3, instead of their corresponding lens system 79 and position detector 81 in the system of FIG. 2, gives the solution to the problem introduced by the system of FIG. 3 and as shown by the following discussion:

Lens system 103 is designed to produce projection of images with high magnification M2, such as image 56d, on the CCD-detectors plane 105 of a CCD matrix camera 104. In the version of the system illustrated in FIG. 3, M2 is the total magnification of lens-system 103 and lens 54. High magnification M2 is needed for high resolution per pixel of the CCD matrix camera 104. The image information from the CCD camera 104 is transferred to image processing unit 116, which is commercially available and supplied by many manufacturers, such as Data Cube, Matrox or Kognex. The image processing unit 116 processes the information from the CCD camera 104, corresponding to the images (e.g., 56d) produced after double reflection from the examined surface 57.

Image-processing unit 116 converts the electrica-information of the image (e.g., 56d) into other electrical-information corresponding to another image having a shape and intensity distribution that is linearly-proportional to the shape and intensity distribution of the images (e.g., 56a, or 84a on the position detector (68) which are produced after only one reflection from the examined surface 57. The images (e.g., 56d) on CCD-detectors plane 105, and the images (e.g., 56a)

on the position detector 68, are proportional in their shape only; thus, the electrical-intensity distribution of the images (e.g., 56d) has to be processed in the image processing unit 116.

The intensities of the images (e.g., 56a) produced on position detector 68 after one reflection, and of the images (e.g., 56d) produced on the CCD-detectors plane 105 after two reflections, are proportional to R(x,y) and $R^2(x,y)$ respectively, when R(x,y) is the local reflectivity of the examined surface 57 from a point defined by the spatial coordinates x and y. Thus, conversion of the electrical-information of the images is done only on their intensity I(i,j) by changing it to √(I-(i,j), wherein I(i,j) is the electrical intensity in the pixel i,j located in row i and column j of the matrix-detectors of CCD-detectors plane 105 in CCD camera 104.

After this conversion, the image processing unit 116 simulates the position deviation δDR from the "absolute reference point" in the i-direction which would be caused by the draw-back of the image that corresponds to the new processed image if it would be measured by a position detector (e.g., 68) located in other than the CCD-detectors plane 105. This simulation is done according to calculations of the intensity center of gravity as follows:

$$\delta DR=(\Sigma\sqrt{(I(i,j))}*i)/(\Sigma\sqrt{(I(i,j))})*K \quad (7)$$

wherein Σ means summation over i and j; and k is a constant which is used for the conversion of the value of the index i of each of the pixels in the CCD-camera into its corresponding distance from the "absolute reference point".

After simulating the amount of the draw-back δDR corresponding to the amount of draw-back δdr on position detector 68, the accurate displacement δh of the examined surface 57 from reference plane 58 can be derived from equation (6). Eq. (6) can be calculated by microprocessor unit 117 which is fed by the outputs 86a and 116a from position detector 86 and image processor 116, respectively.

It is obvious that the positions of the second detector (camera 104) and its lens-system 103, can be switched with the first detector (68) and its lens-system 67. In such a switched arrangement, the amount of the position-deviation from the "absolute reference point"3, which corresponds to the mount of the draw-back δDR after double reflection of the beam from the examined-surface, is measured from the images (e.g., that are produced on the position detector in its new location. The CCD camera in its new location produces an electrical signal that is proportional to the intensity of the images (e.g., 56a or 84a) that are projected on its detectors-matrix after only one reflection of the beam from the examined-surface.

The displacement of the images δH in the i direction is simulated by the image-processing unit 116 which is fed with the electrical signal that is produced by the CCD camera in its new location. The simulation of δH is done according to the calculations of intensity center of gravity which are given by:

$$\delta H=(\Sigma I^2(i,j)*i)/\Sigma I^2(i,j)*K \quad (8)$$

Another useful configuration is achieved by modifying the system illustrated in FIG. 3 when the pair of lens-system 67 and position detector 68 is replaced by a pair similar to that of lens-system 103 and CCD camera 104 which remain in their position. The position deviation δDR from the "absolute reference point" in the i-direction is measured by CCD camera 104 relative to a marking point in the image (e.g., 56d) which is projected on CCD-camera 104. δH, the position deviation in the i-direction, of images (e.g., 56a or 84a) which are projected on the other CCD camera is measured by the same other CCD camera relative to a marking point in the image (e.g., 56a or 84a) which corresponds to the marking point of the image (e.g., 56d) on the CCD-camera 104. The marking point can be chosen arbitrarily, for example it can be chosen as the point with the highest intensity. The accurate displacement δh of the examined surface 57 from reference plane 58 is calculated according to equations (6).

For proper operation of the system illustrated in FIG. 3, the measurement range of the displacement-distance δh of the examined surface 57, from the reference plane 58, depends on the same conditions as described for the system illustrated in FIG. 2. According to these conditions, all images, such as images 56 or 84, 56a or 84a and 56d, have to be located within the range of the depths of focus DOF54 and DOF61, DOF67 and DOF103, respectively, when DOF103 is the depth of focus of lens-system 103. The relationships between distance displacement δh, depths of focus DOF54, DOF61, DOF67 and DOF103, and the dynamic range required from position detector 68 and CCD-detectors plane 105, are the same as discussed above with respect to FIG. 2.

The dynamic range required from CCD camera 104 in the system illustrated in FIG. 3, or from the position detector that replaces CCD camera 104 in modified version of the system illustrated in FIG. 3, is wider than that required from the position detectors 68 and 81 of the system illustrated in FIG. 2. A wider dynamic range is needed because the above mentioned detectors of the system illustrated in FIG. 3 detect the image intensity after double of reflection of the beam from the examined surface 57, while the detectors of the system illustrated in FIG. 2 detect the intensity of the image after only one reflection of the beam from examined surface 57.

On the other hand, for most of the situations this dynamic range is still narrower or in very few situations is equal to the dynamic range required from the position detector 27 of the system illustrated in FIG. 1 according to the above cited prior art U.S. Pat. No. 4,356,392, for the following reasons:

In the system illustrated in FIG. 1, when the examined-surface 14 is located in reference plane 15, the total image-intensity on position detector 27 is collected after double reflection of the beam from the examined-surface. The double reflection of the beam is done when the image-pattern is projected symmetrically, and reflected from its generating pattern on examined surface 14. In this situation the total intensity on position detector 27 is proportional to:

$$2*\Sigma R(x,y)*R(x',y') \quad (9)$$

wherein (x,y) is a point in the radiation spot 13 projected on the examined surface 14 that is identify by the spatial coordinates x and y; (x',y') is the symmetric point to point (x,y) with respect to the center of radiation spot 13; R(x,y) is the local reflection from the examined surface 57 at point (x,y); R(x', y') is the local reflection from examined surface 57 at point (x',y'); and Σ is a summation over x and y.

In the system illustrated in FIG. 3, the total image intensity on CCD camera 104 is collected also after double reflection of the beam from the examined-surface. But in this situation, the double reflection of the beam is done when the image-pattern is projected exactly on and reflected from its generating pattern on examined surface 57. In this situation the total intensity on CCD camera 104 is proportional to:

$$\Sigma(R^2(x,y)+R^2(x',y')) \quad (10)$$

wherein $\Sigma$ is a summation over x, y, x' and y'.

Since $R^2(x,y)+R^2(x',y')$ is greater than $2*R(x,y)*R(x',y')$ and they are equal only if $R(x,y)=R(x',y')$, it is clear that the intensity on the CCD camera 104 of the system illustrated in FIG. 3 that is given by expression (10) is higher than or is equal to the intensity on position detector 27 of the system illustrated in FIG. 1, which is given by expression (9).

For narrowing the dynamic range required from the CCD camera 104 and the position detector 68, the system illustrated in FIG. 3 includes a sub-system for automatic intensity control. This sub-system consists of controller 88 and circular neutral-density filter 53 integrated with a stepping-motor 89. The controller 88 is fed by an electrical signal from the output 116a of the image processing unit 116 which is proportional to the intensity of the beam (e.g., 115) on the CCD-detectors plane 105. The stepping-motor 89 is fed by an electrical signal which is produced by the controller 88 in order to control the stepping-motor. The circular neutral-density filter 53 is rotated by the controlled stepping-motor 89 into a position with an attenuation which maintains constant beam intensity on the CCD camera 104 and position detector 68.

In spite of the need to align precisely the projection of the image pattern back on its generating pattern under the spots (e.g., 56 or 84) on the examined surface 57, the system operates well with low sensitivity to position and rotation tolerances of its optical components. This low sensitivity is achieved because all the deviation caused by these tolerances in the ongoing optical path are compensated and cancelled out in the coming-back optical path returned back from the retro-reflector 101. Only fie retro-reflector 101 has to be manufactured very precisely; such reflectors are commercially available and are supplied for example by Mells Griot, product No. 02 CCG 008. The position and orientation of retro-reflector 101 can be tolerated without affecting the system operation as long as beams 65b, 107b and 109 path through its entrance/exit.

According to the definition of the stability of a system given in the description of FIG. 2, the stability of the system illustrated in FIG. 3 is similar to that of the system of illustrated in FIG. 2. The system illustrated in FIG. 3 does not need to be realigned as long as the images (e.g., 56 or 84, 56a or 84a and 56d) are located within the range of the depths of focus DOF54 and DOF61, DOF67 and DOF103, respectively. In some situations tolerating deviations in the position of some optical components, there is no need for realignment of the system as long as the above conditions for proper operation are satisfied. All that is needed in this situation, for accurate measurement of the displacement $\delta h$ of the examined surface 57 from reference plane 58, is to recalibrate the system. Recalibration of the system means redefinition of the position of the "absolute reference point" on the CCD-detectors plane 105, and of the position of image 56a on the position detector 68 corresponding to the position of the examined surface 57 with a mirror like surface which is located in the reference plane 58.

While the invention has been described with respect to several preferred embodiments, it will be appreciated that they are set forth purely for purposes of example, and that many other variations, modifications and applications of the invention may be made.

What is claimed is:

1. A method of measuring the distance of an examined surface from a reference plane, comprising the steps:

(a) directing a parallel beam of radiation along a first optical path which includes first focussing means for focussing the parallel beam as a spot on the examined surface and reflecting it therefrom as a reflected beam;

(b) converting the reflected beam to a parallel beam;

(c) directing a part of the reflected parallel beam through a second optical path which includes second focussing means for focussing the spot on a surface of a first detector located such that the position of the spot on the first detector includes both:

(i) drawback errors caused by variations in reflectivity, scattering, and/or interference in the examined surface; and (ii) a plane displacement error, representing the distance between the plane of the examined surface and the reference plane;

(d) directing another part of the reflected parallel beam through a third optical path which includes third focussing means for focussing the spot on a surface of a second detector located such that the position of the spot on the second detector includes only said drawback errors (i); *and*

(e) [and] utilizing the outputs of said first and second detectors for providing a measurement of the distance of the examined surface from the reference plane.

2. The method according to claim 1, wherein [the magnification in] said second optical path *and said third optical path include respectively different magnification means* [is different from that in said third optical path]; said step (e) [including] *includes* adjusting the drawback errors (i) detected by the second detector in-step (e) by the ratio between the two magnifications in utilizing the outputs of the first and second detectors for providing a measurement of said plane displacement error (ii) alone.

3. The method according to claim 1, wherein said surface of the first detector is coplanar with a virtual axis of said first focussing means.

4. The method according to claim 1, wherein said surface of the second detector is perpendicular to a virtual axis of said first focussing means.

5. The method according to claim 4, wherein said third optical path includes a first focussing lens focussing the spot on the optical axis of a second focussing lens which in turn focusses the spot on the optical axis of a third focussing lens whose optical axis is perpendicular to said surface of the second detector.

6. The method according to claim 1, wherein said third optical path is a straight path separate and distinct from said second optical path.

7. The method according to claim 1, wherein the part of the parallel beam in said third optical path is reflected back towards said first optical path and is focussed on said spot of the examined surface and then on said second detector.

8. The method according to claim 7, wherein one of said detectors is a CCD camera and includes image processing means which processes the output of the camera to determine from the image focussed thereon the drawback errors corresponding to those detected by the first detector.

9. The method according to claim 8, wherein said second detector is the CCD camera and includes said image processing means.

10. The method according to claim 1, wherein said first optical path includes a variable intensity filter which is controlled by the output of at least one of said detectors to maintain a constant beam intensity.

11. Apparatus for measuring the distance of an examined surface from a reference plane, comprising:

(a) a first detector;

(b) a second detector;

(c) means for directing a parallel beam of radiation along a first optical path which includes first focussing means for focussing the parallel beam as a spot on the examined surface and reflecting it therefrom as a reflected beam;

(d) means for converting the reflected beam to a parallel beam;

(e) means for directing a part of the reflected parallel beam through a second optical path which includes second focussing means for focussing the spot on a surface of said first detector located such that the position of the spot on the first detector includes both:
(i) drawback errors caused by variations in reflectivity, scattering, and/or interference in the examined surface; and
(ii) a plane displacement error, representing the distance between the plane of the examined surface and the reference plane;

(f) means for directing another part of the reflected parallel beam through a third optical path including third focussing means for focussing the spot on a surface of said second detector located such that the position of the spot on the second detector includes only said drawback errors (i); *and*

(g) [and] means for utilizing the outputs of said first and second detectors for providing a measurement of the distance of the examined surface from the reference plane.

12. The apparatus according to claim 11, wherein [the magnification in] said second optical path [is different from that in said third optical path] *and said third optical path include respectively different magnification means*; said means (g) [including] *includes* means for adjusting the drawback error (i) detected by the second detector by the ratio between the two magnifications in utilizing the outputs of the first and second detectors for providing a measurement of said plane displacement error (ii) alone.

13. The apparatus according to claim 11, wherein said surface of the first detector is coplanar with a virtual axis of said first focussing means.

14. The apparatus according to claim 11, wherein said surface of the second detector is perpendicular to a virtual axis of said first focussing means.

15. The apparatus according to claim 14, wherein said third optical path includes a first focussing lens focussing the spot on the optical axis of a second focussing lens which in turn focusses the spot on the optical axis of a third focussing lens whose optical axis is perpendicular to said surface of the second detector.

16. The apparatus according to claim 11, wherein said third optical path is a straight path separate and distinct from said second optical path.

17. The apparatus according to claim 11, wherein said third optical path includes a retro-reflector which reflects said parallel beam in said path back towards said first optical path, and focussing means which focusses said reflected back beam on said spot of the examined surface and then on said second detector.

18. The apparatus according to claim 17, wherein one of said detectors is a CCD camera and includes image processing means which processes the output of the camera to determine from the image focussed thereon the drawback errors corresponding to those detected by the first detector.

19. The apparatus according to claim 18, wherein said second detector is the CCD camera and includes said image processing means.

20. The apparatus according to claim 11, wherein said first optical path includes a variable intensity filter, said apparatus further including control means for controlling said filter in accordance with the output of at least one of said detectors to maintain a constant beam intensity.

*21. A method of measuring the distance of an examined surface from a reference plane, comprising the following steps:*

*(a) directing a radiation beam along a first optical path which includes first focussing means for focussing said radiation beam as a spot on said examined surface and reflecting it therefrom as a reflected radiation, said first focussing means arranged to collect and convert said reflected radiation to a reflected beam;*

*(b) directing a part of said reflected beam through a second optical path which includes second focussing means for focussing said part of said reflected beam onto a first spot on a surface of a first detector located such that the position of said first spot on said first detector includes both:*
*(i) drawback errors caused by variations in reflectivity, scattering, and/or interference in said examined surface; and*
*(ii) a plane displacement, representing the distance between the plane of said examined surface and said reference plane;*

*(c) directing another part of said reflected beam through a third optical path which includes third focussing means for focussing said other part of said reflected beam onto a second spot on a surface of a second detector, such that the position of said second spot on said second detector includes only said drawback errors; and*

*(d) utilizing the outputs of said first and second detectors for providing a measurement of the distance of said examined surface from said reference plane.*

*22. The method of claim 21 wherein said detectors are position-sensitive detectors.*

*23. The method of claim 21 wherein said detectors are charge-coupled device cameras and image processing means which process the output of said cameras to determine from images focussed thereon any drawback errors corresponding to those detected by said second detector and both, plane displacement errors and drawback errors corresponding to those detected by said first detector.*

*24. The method of claim 21 wherein one of said detectors is a position-*sensitive detector.

*25. The method of claim 21 wherein one of said detectors is a charge-coupled device camera and includes image processing means.*

*26. The method of claim 21 wherein said radiation beam is a parallel beam.*

*27. The method of claim 21 wherein said reflected beam is a parallel beam.*

*28. The method of claim 21 wherein said radiation beam and said reflected beam are parallel beams.*

*29. The method of claim 21 wherein said first focussing means comprises at least one lens.*

*30. The method of claim 21 wherein said first focussing means comprises at least one lens for focussing said radiation beam and for collecting and converting said reflected radiation to a reflected beam.*

*31. The method of claim 21 wherein said first focussing means comprises one lens for focussing said radiation beam and another lens for collecting and converting said reflected radiation to a reflected beam.*

*32. The method of claim 21 wherein said second and third optical paths include magnification means, the magnification means in said second optical path being different from that in said third optical path; said step (d) includes adjust-*

*ing the drawback errors detected by said second detector in step (d) by the ratio between said magnifications in utilizing the outputs of said first and second detectors for providing a measurement of said plane displacement error alone.*

*33. The method of claim 21 wherein said surface of said first detector is coplanar with a virtual axis Of said first focussing means.*

*34. The method of claim 21 wherein said surface of said second detector is perpendicular to a virtual axis of said first focussing means.*

*35. The method of claim 21 wherein said third optical path includes a first focussing lens for focussing a first spot on an optical axis of a second focussing lens which in turn focusses a second spot onto said onto an optical axis of a third focussing lens whose optical axis is perpendicular to said surface of said second detector.*

*36. The method of claim 21 wherein said third optical path is a straight path separate and distinct from said second optical path.*

*37. The method of claim 21 wherein said part of said reflected beam in said third optical path is a parallel beam and said third optical path includes means for reflecting said beam back towards said first optical path and focussing said beam onto said spot on said examined surface and then onto said second detector.*

*38. The method of claim 37 wherein said first detector is a charge-coupled device camera and includes image processing means.*

*39. The method of claim 37 wherein said detectors are charge-coupled device cameras and include image processing means.*

*40. The method of claim 37 wherein said radiation beam and said reflected beam are parallel beams.*

*41. The method of claim 37 wherein said first focussing means comprises at least one lens for focussing said radiation beam and for collecting and converting said reflected radiation to a reflected beam.*

*42. The method of claim 37 wherein said first focussing means comprises one lens for focussing said radiation beam and another lens for collecting and converting said reflected radiation to a reflected beam.*

*43. The method of claim 37 wherein said first focussing means for focussing said radiation beam comprises at least one lens.*

*44. Apparatus for measuring the distance of an examined surface from a reference plane, comprising:*

*(a) a first detector;*

*(b) a second detector;*

*(c) means for directing a radiation beam along a first optical path which includes first focussing means for focussing said radiation beam as a spot on said examined surface and reflecting it therefrom as reflected radiation; said first focussing means arranged to collect and convert said reflected radiation to a reflected beam;*

*(d) means for directing a part of said reflected beam through a second optical path which includes second focussing means for focussing said part of said reflected beam onto a first spot on a surface of said first detector located such that the position of said first spot on said first detector includes both:*

*(i) drawback errors caused by variations in reflectivity, scattering, and/or interference in said examined surface; and*

*(ii) a plane displacement, representing the distance between the plane of said examined surface and said reference plane; and*

*(e) means for directing another part of said reflected beam through a third optical path which includes third focussing means for focussing said other part of said reflected beam into a second spot on a surface of said second detector, said second detector being located such that the position of said second spot on said second detector includes only said drawback errors;*

*(f) whereby the outputs of said first and second detectors can be utilized to provide a measurement of the distance of said examined surface from said reference plane.*

*45. The apparatus of claim 44 wherein said detectors are position-sensitive detectors.*

*46. The apparatus of claim 44 wherein said detectors are charge-couple device cameras and image processing means which process said output of said cameras to determine from images focussed thereon any drawback errors corresponding to those detected by said second detector and both, plane displacement errors and drawback errors corresponding to those detected by said first detector.*

*47. The apparatus of claim 44 wherein one of said detectors is a position-sensitive detector.*

*48. The apparatus of claim 44 wherein one of said detectors is a charge-coupled device camera and includes image processing means.*

*49. The apparatus of claim 44 wherein said radiation beam is a parallel beam.*

*50. The apparatus of claim 44 wherein said reflected beam is a parallel beam.*

*51. The apparatus of claim 44 wherein said radiation beam and said reflected beam are parallel beams.*

*52. The apparatus of claim 44 wherein said first focussing means comprises at least one lens.*

*53. The apparatus of claim 44 wherein said first focussing means comprises at least one lens for focussing said radiation beam and for collecting and converting said reflected radiation to a reflected beam.*

*54. The apparatus of claim 44 wherein said first focussing means comprises one lens for focussing said radiation beam and another lens for collecting and converting said reflected radiation to a reflected beam.*

*55. The apparatus of claim 44 wherein said second and third optical paths include magnification means, the magnification means in said second optical path being different from that in said third optical path; said step (f) includes adjusting the drawback errors detected by said second detector in step (f) by the ratio between said magnifications in utilizing the outputs of said first and second detectors for providing a measurement of said plane displacement error alone.*

*56. The apparatus of claim 44 wherein said surface of the first detector is coplanar with a virtual axis of said first focussing means.*

*57. The apparatus of claim 44 wherein said surface of the second detector is perpendicular to a virtual axis of said first focussing means.*

*58. The apparatus of claim 44 wherein said third optical path includes a first focussing lens for focussing a first spot onto the optical axis of a second focussing lens which in turn focusses a second spot onto an optical axis of a third focussing lens whose optical axis is perpendicular to said surface of said second detector.*

*59. The apparatus of claim 44 wherein said third optical path is a straight path separate and distinct from said second optical path.*

*60. The apparatus of claim 44 wherein said part of said reflected beam in said third optical path includes a retro-*

*reflector which reflects said reflected beam which is a parallel beam in said third optical path back towards said first optical path, and focussing means which focusses said reflected back beam as said spot on said examined surface and then onto said second detector.*

*61. The apparatus of claim 60 wherein said first detector is a charge-coupled device camera which includes image processing means.*

*62. The apparatus of claim 60 wherein said detectors are charge-coupled device cameras and includes image processing means.*

*63. The apparatus of claim 60 wherein said radiation beam and said reflected beam are parallel beams.*

*64. The apparatus of claim 60 wherein said first focussing means comprises at least one lens for focussing said radiation beam and for collecting and converting said reflected radiation to a reflected beam.*

*65. The apparatus of claim 60 wherein said first focussing means comprises one lens for focussing said radiation beam and another lens for collecting and converting said reflected radiation to a reflected beam.*

*66. The apparatus of claim 60 wherein said first focussing means for focussing said radiation beam comprises at least one lens.*

* * * * *